(12) United States Patent
Rudolph

(10) Patent No.: US 10,566,496 B2
(45) Date of Patent: Feb. 18, 2020

(54) OPTOELECTRONIC SEMICONDUCTOR CHIP AND METHOD FOR PRODUCING SAME

(71) Applicant: OSRAM Opto Semiconductors GmbH, Regensburg (DE)

(72) Inventor: Andreas Rudolph, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 15/756,025

(22) PCT Filed: Aug. 26, 2016

(86) PCT No.: PCT/EP2016/070173
§ 371 (c)(1),
(2) Date: Feb. 27, 2018

(87) PCT Pub. No.: WO2017/036949
PCT Pub. Date: Mar. 9, 2017

(65) Prior Publication Data
US 2018/0261717 A1    Sep. 13, 2018

(30) Foreign Application Priority Data

Aug. 31, 2015 (DE) .................. 10 2015 114 478

(51) Int. Cl.
*H01L 33/06* (2010.01)
*H01L 33/00* (2010.01)
(Continued)

(52) U.S. Cl.
CPC .......... *H01L 33/06* (2013.01); *H01L 33/0062* (2013.01); *H01L 33/025* (2013.01);
(Continued)

(58) Field of Classification Search
CPC ... H01L 33/06; H01L 33/0062; H01L 33/025; H01L 33/305; H01L 33/04; H01S 5/34333
See application file for complete search history.

(56) References Cited

U.S. PATENT DOCUMENTS

| 4,941,025 A | 7/1990 | Tabatabaie |
| 5,929,462 A | 7/1999 | Kasukawa et al. |

(Continued)

FOREIGN PATENT DOCUMENTS

DE    102011112713 A1    3/2013

*Primary Examiner* — Didarul A Mazumder
*Assistant Examiner* — Patricia D Reddington
(74) *Attorney, Agent, or Firm* — McDermott Will & Emery LLP

(57) ABSTRACT

An optoelectronic semiconductor chip (10) is specified, comprising a p-type semiconductor region (4), an n-type semiconductor region (6), and an active layer arranged between the p-type semiconductor region (4) and the n-type semiconductor region (6), said active layer being designed as a multiple quantum well structure (5), wherein the multiple quantum well structure (5) comprises quantum well layers (53) and barrier layers (51), wherein the barrier layers (51) are doped, and wherein undoped intermediate layers (52, 54) are arranged between the quantum well layers (53) and the barrier layers (51). Furthermore, a method for producing the optoelectronic semiconductor chip (10) is specified.

13 Claims, 2 Drawing Sheets

Figure 1:
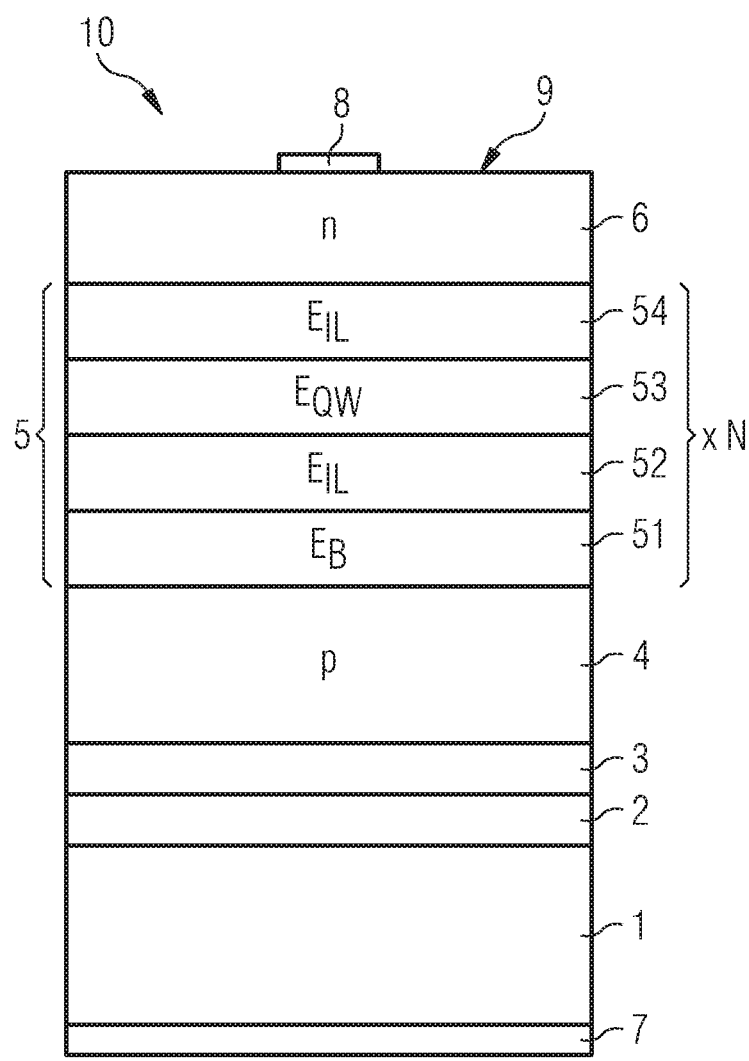

(51) Int. Cl.
*H01L 33/02* (2010.01)
*H01L 33/30* (2010.01)
*H01L 33/04* (2010.01)
*H01S 5/343* (2006.01)

(52) U.S. Cl.
CPC ............ *H01L 33/305* (2013.01); *H01L 33/04* (2013.01); *H01L 33/30* (2013.01); *H01S 5/34333* (2013.01)

(56) References Cited

U.S. PATENT DOCUMENTS

| | | | | |
|---|---|---|---|---|
| 2003/0013319 | A1* | 1/2003 | Holmes | H01L 21/8221 438/761 |
| 2006/0027814 | A1* | 2/2006 | Watanabe | B82Y 20/00 257/79 |
| 2009/0194784 | A1* | 8/2009 | Kaji | H01L 33/16 257/103 |
| 2010/0019223 | A1* | 1/2010 | Kang | H01L 33/06 257/13 |
| 2014/0354366 | A1* | 12/2014 | Suzuki | H01S 5/0421 331/94.1 |

* cited by examiner

OPTOELECTRONIC SEMICONDUCTOR CHIP AND METHOD FOR PRODUCING SAME

The invention relates to an optoelectronic semiconductor chip and to a method for producing same.

CROSS-REFERENCE OF RELATED APPLICATIONS

This patent application is the U.S. National Phase under 35 U.S.C. § 371 of International Patent Application No. PCT/EP2016/070173, filed on Aug. 26, 2016, which in turn claims the priority of German patent application 10 2015 114 478.6, filed on Aug. 31, 2015, the disclosure content of which is hereby incorporated by reference.

The generation of radiation in the active layer of an optoelectronic semiconductor chip is based on the radiative recombination of electrons and holes with the emission of a photon. Non-radiative recombinations of electrons and holes are a possible loss mechanism in radiation-emitting semiconductor chips. To increase the efficiency of an optoelectronic semiconductor chip, it is therefore advantageous to reduce the proportion of non-radiative recombinations.

The invention is based on the object of providing an optoelectronic semiconductor chip in which non-radiative recombinations of electrons and holes are reduced. Furthermore, a method for producing the optoelectronic semiconductor chips is to be provided.

These objects are achieved by an optoelectronic semiconductor chip and a method according to the independent claims. Advantageous embodiments and developments of the invention are subject matter of the dependent claims.

The optoelectronic semiconductor chip according to at least one embodiment comprises a p-type semiconductor region, an n-type semiconductor region and an active layer arranged between the p-type semiconductor region and the n-type semiconductor region, said active layer being in the form of a multi-quantum-well structure.

According to at least one embodiment, the multi-quantum-well structure has quantum-well layers and barrier layers. The barrier layers have a larger band gap than the quantum-well layers. The multi-quantum-well structure is in particular a periodic layer sequence, in which each period has a quantum-well layer and a barrier layer. In the quantum-well structure described here, the barrier layers are advantageously doped and, between the barrier layers and the quantum-well layers, undoped intermediate layers are arranged.

The doping of the barrier layers of the multi-quantum-well structure is advantageous in order to enable short switching times to be achieved in the optoelectronic semiconductor chip. The barrier layers are e.g. p-doped, the dopant being for example carbon.

It has been shown that doping of the barrier layers is advantageous for achieving short switching times. On the other hand, however, it has been found that non-radiative recombinations can occur to an increased degree at the interface between the doped barrier layers and the quantum-well layers if the barrier layers directly adjoin the quantum-well layers. This is based in particular on the fact that the electrons can come into contact with the ionized dopant atoms at the interface between the quantum-well layers and the barrier layers. More precisely, an overlap of the electron wave function with the wave function of the dopant atoms in directly mutually adjacent barrier layers and quantum-well layers would be non-zero, which would result in non-radiative recombinations and thus a loss of brightness.

In the optoelectronic semiconductor chip described here, the overlap between the electron wave function and the wave function of the ionized dopant atoms of the barrier layers is advantageously reduced by means of undoped intermediate layers being arranged between the doped barrier layers and the quantum-well layers. Advantageously, the doped barrier layers and the quantum-well layers thus do not adjoin one another directly but are spaced apart from one another by the undoped intermediate layers. In this way, losses of brightness due to non-radiative recombinations are reduced and the efficiency of the optoelectronic semiconductor chip is thus increased.

According to at least one advantageous embodiment, the doped barrier layers each adjoin an undoped intermediate layer on both sides. In other words, viewed in the growth direction of the multi-quantum-well structure, an undoped intermediate layer is arranged both above and below each barrier layer. The multi-quantum-well structure can in particular be a periodic layer sequence in which each period has a first undoped intermediate layer, a doped barrier layer, a second undoped intermediate layer and a quantum-well layer. In particular, each period of the multi-quantum-well layers can consist of precisely the above-mentioned four layers. The multi-quantum-well structure in this embodiment advantageously has no interfaces between a doped barrier layer and a quantum-well layer. Losses due to non-radiative recombinations are reduced particularly effectively in this way.

According to an advantageous embodiment, the undoped intermediate layers are between 1 nm and 10 nm thick. A thickness of at least 1 nm is advantageous to reduce the overlap between the electron wave function and the wave function of the dopant atoms in the barrier layers effectively.

Furthermore, it is advantageous if the undoped intermediate layers are comparatively thin, since too great a thickness of the undoped intermediate layers could have a negative effect on the switching times of the optoelectronic semiconductor chip. Particularly preferably, the undoped intermediate layers are less than 3 nm thick. Furthermore, it is advantageous if the undoped intermediate layers are thinner than the doped barrier layers.

According to a preferred embodiment, the multi-quantum-well structure is based on an arsenide compound semiconductor. Preferably, the quantum-well layers comprise $In_xAl_yGa_{1-x-y}As$ with $0 \leq x \leq 1$, $0 \leq y \leq 1$ and $x+y \leq 1$. The barrier layers and/or the undoped intermediate layers preferably comprise $Al_mGa_{1-m}As_nP_{1-n}$ with $0 \leq m \leq 1$ and $0 \leq n \leq 1$.

The band gaps of the barrier layers, quantum-well layers and intermediate layers can be adjusted in particular by the material composition. An increase in the band gap can be achieved in particular by increasing the aluminum content y and/or reducing the indium content x. Preferably, the barrier layers have a greater aluminum content than the quantum-well layers. In particular, the quantum-well layers can be free from aluminum. The quantum-well layers preferably have a greater indium content than the barrier layers, the barrier layers preferably being free from indium.

According to at least one advantageous embodiment, the band gap of the undoped intermediate layers substantially corresponds to the band gap of the doped barrier layers. Preferably, a difference between the electronic band gaps of the doped barrier layers and the undoped intermediate layers is no more than 0.1 eV.

The undoped intermediate layers therefore have substantially the same electrooptical properties as the barrier layers.

In particular, the undoped intermediate layers have a greater band gap than the quantum-well layers and in this way, like the barrier layers, they cause a confinement of charge carriers in the quantum-well layers.

According to at least one advantageous embodiment, the barrier layers have substantially the same material composition as the undoped intermediate layers, apart from a dopant. "Substantially the same material composition" here is intended to mean in particular that the contents of the elements of the semiconductor materials in the barrier layers and the intermediate layers differ from one another by no more than 10%, particularly preferably no more than 5%. The barrier layers preferably comprise $Al_{m1}Ga_{1-m1}As_{n1}P_{1-n1}$ with $0 \leq m1 \leq 1$ and $0 \leq n1 \leq 1$. The undoped intermediate layers preferably comprise $Al_{m2}Ga_{1-m2}As_{n2}P_{1-n2}$ with $0 \leq m2 \leq 1$ and $0 \leq n2 \leq 1$. The following preferably applies here: $|m1-m2| \leq 0.1$, particularly preferably $|m1-m2| \leq 0.05$. Furthermore, the following preferably applies: $|n1-n2| \leq 0.1$, particularly preferably $|n1-n2| \leq 0.05$.

In the intermediate layers, $n2=1$ preferably applies, i.e. the intermediate layers preferably comprise a ternary semiconductor material with the composition $Al_{m2}Ga_{1-m2}As$ with $0 \leq m2 \leq 1$. The phosphorus content of the intermediate layers $1-n2$ is thus preferably equal to zero. A ternary compound semiconductor material is advantageously easier to produce than a quaternary compound semiconductor material. If the barrier layers have a phosphorus content $1-n1>0$, the aluminum content m2 in the intermediate layers is preferably greater than the aluminum content m1 of the intermediate layers. Preferably, therefore, the following applies: $1-n1<0$, $n2=1$ and $m2>m1$. As a result of the higher aluminum content of the intermediate layers, the band gap is advantageously increased to counteract a reduction in the band gap compared to the barrier layers due to the lack of a phosphorus content.

The optoelectronic semiconductor chip is preferably a light-emitting diode emitting in the infrared range of the spectrum. The optoelectronic semiconductor chip can have an emission wavelength of e.g. between 750 nm and 1000 nm.

The method for producing the optoelectronic semiconductor chip according to at least one embodiment comprises an epitaxial growth of a semiconductor layer sequence having a p-type semiconductor region, an n-type semiconductor region and an active layer arranged between the p-type semiconductor region and the n-type semiconductor region, which active layer is in the form of a multi-quantum-well structure. The multi-quantum-well structure comprises quantum-well layers and barrier layers, the barrier layers being doped. Between the quantum-well layers and the barrier layers, an undoped intermediate layer is arranged in each case. The epitaxial growth preferably takes place by means of MOVPE.

In the method, the undoped intermediate layers are advantageously grown at a higher growth temperature than the doped barrier layers. The higher growth temperature during the growth of the undoped intermediate layers compared to the growth temperature during the growth of the barrier layers has the advantage that the unintentional incorporation of impurities into the undoped intermediate layers is reduced. Unintentionally incorporated impurities could otherwise act as non-radiative recombination centers. By avoiding non-radiative recombinations at impurities, the efficiency of the radiation generation in the optoelectronic semiconductor chip is advantageously increased further. Preferably, the growth temperature during the growth of the undoped intermediate layers is at least 650° C.

The doped barrier layers are preferably grown at a growth temperature of less than 600° C. The lower growth temperature during the growth of the barrier layers has the advantage that the incorporation of dopant atoms into the barrier layers is favored. By reducing the barrier layers, an optoelectronic semiconductor chip with comparatively short switching times can be achieved. The barrier layers can be doped e.g. with C.

Further advantageous embodiments of the method can be taken from the description of the optoelectronic component and vice versa.

The invention is explained in more detail below with the aid of exemplary embodiments in association with FIGS. 1 to 3.

Figure 2:
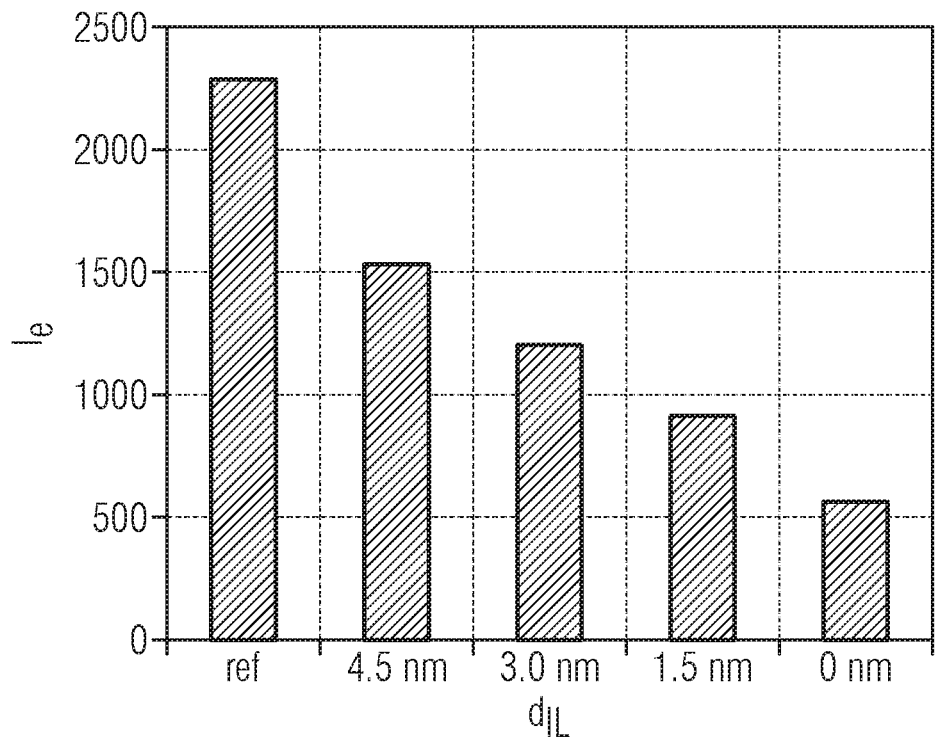
Figure 3:
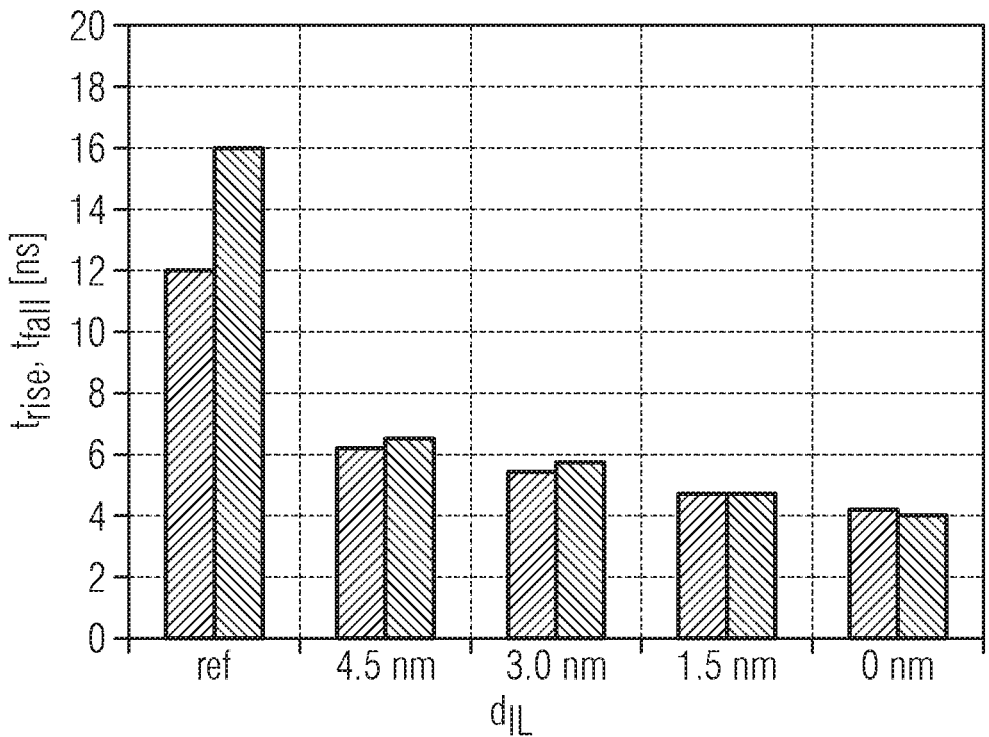

The figures show the following:

FIG. 1 shows a schematic illustration of a cross-section through an optoelectronic semiconductor chip according to an exemplary embodiment, FIG. 2 shows a bar diagram of the brightness $I_e$ of the emitted radiation for various thicknesses $d_{IL}$ of the intermediate layers and FIG. 3 shows a bar diagram of the rise times $t_{rise}$ and the fall times $t_{fall}$ of the emitted radiation in pulsed mode for various thicknesses $d_{IL}$ of the intermediate layers.

The components illustrated and the size ratios to one another of the components should not be regarded as being to scale.

The optoelectronic semiconductor chip 10 according to one exemplary embodiment illustrated in FIG. 1 is an LED chip comprising a p-type semiconductor region 4, an n-type semiconductor region 6 and an active layer 5 capable of emitting radiation, which is arranged between the p-type semiconductor region 4 and the n-type semiconductor region 6. The LED chip 10 is preferably an LED chip emitting in the infrared range of the spectrum.

In the exemplary embodiment of the optoelectronic semiconductor chip 10, the chip is a so-called thin-film semiconductor chip, from which a growth substrate originally used for the epitaxial growth of the semiconductor layers 4, 5, 6 has been removed and instead, the semiconductor layer sequence has been connected by means of a connecting layer 2, in particular a solder layer, to a carrier substrate 1 which is different from the growth substrate.

In a thin-film LED chip 10 of this type, the p-type semiconductor region 4 generally faces towards the carrier substrate 1. Between the p-type semiconductor region 4 and the carrier substrate 1, a mirror layer 3 is advantageously arranged, which advantageously deflects radiation emitted towards the carrier substrate 1 towards a radiation exit surface 9 of the optoelectronic semiconductor chip. The mirror layer 3 is e.g. a metal layer, which contains Ag, Al or Au.

For the electrical contacting of the optoelectronic semiconductor chip 10, e.g. a first contact layer 7 can be provided on a rear side of the carrier substrate 1 and a second contact layer 8 on a subregion of the radiation exit surface 9.

The p-type semiconductor region 4 and the n-type semiconductor region 6 can each be composed of multiple sublayers and do not necessarily have to consist exclusively of p-doped layers or n-doped layers but can also comprise e.g. one or more undoped layers.

As an alternative to the exemplary embodiment illustrated, the optoelectronic semiconductor chip 10 could also have an opposite polarity, i.e. the n-type semiconductor region 6 could face towards a substrate and the p-type semiconductor region 4 towards a radiation exit surface 9 of the optoelectronic semiconductor chip (not illustrated). This is generally the case in optoelectronic semiconductor chips in which the growth substrate used for the epitaxial growth of the semiconductor layers is not removed, since the n-type semiconductor region is generally grown first on the growth substrate.

The active layer of the optoelectronic semiconductor chip 10 provided to emit radiation is in the form of a multi-quantum-well structure 5. The multi-quantum-well structure 5 comprises a plurality of alternately arranged quantum-well layers 53 and barrier layers 51. The quantum-well layers 53 have a band gap $E_{QW}$ und the barrier layers 53 have a band gap $E_B > E_{QW}$. The multi-quantum-well structure 5 is in particular a periodic layer sequence comprising a number N of periods, wherein N is preferably between 2 and 50. For example, the multi-quantum-well structure can comprise twelve periods.

The barrier layers 51 in the multi-quantum-well structure 5 are doped. The dopant concentration in the barrier layers 51 is advantageously at least $1*10^{18}$ cm$^{-3}$, preferably at least $1*10^{19}$ cm$^{-3}$, e.g. for instance $3*10^{19}$ cm$^{-3}$. The doping of the barrier layers 51 has the advantage that comparatively short switching times can be achieved in the optoelectronic semiconductor chip.

Between the quantum-well layers 53 and the barrier layers 51, undoped intermediate layers 52, 54 are advantageously arranged. A period of the quantum-well structure can consist of e.g. a doped barrier layer 51, a first undoped intermediate layer 52, a quantum-well layer 53 and a second undoped intermediate layer 54, wherein each quantum-well layer 53 adjoins an undoped intermediate layer 52, 54 on both sides. The quantum-well layer 53 therefore advantageously has no interface with a doped barrier layer 51. This has the advantage that electrons in the quantum-well layers 53 do not come into direct contact with the ionized dopant atoms of the barrier layers 51. More precisely, an overlap of the electron wave function with the wave function of the ionized dopant atoms in the barrier layers 51 is reduced. In this way, non-radiative recombinations of electrons are reduced and the efficiency of the optoelectronic semiconductor chip 10 is thus increased.

The undoped intermediate layers 52, 54 preferably have a thickness of at least 1 nm and no more than 10 nm, particularly preferably no more than 3 nm. The undoped intermediate layers 52, 54 are preferably thinner than the barrier layers 51 and/or the quantum-well layers 53. The short switching times that are made possible by the doping of the barrier layers are preferably not substantially affected by the undoped intermediate layers, which are thin compared to the barrier layers.

In the exemplary embodiment illustrated in FIG. 1, for example, the barrier layer 51 can have a thickness of 8.4 nm, the first undoped intermediate layer 52 a thickness of 1.4 nm, the quantum-well layer 53 a thickness of 4.4 nm and the second undoped intermediate layer 54 a thickness of 1.4 nm.

During the production of the multi-quantum-well structure 5, the barrier layers 51 are preferably grown at a lower growth temperature than the undoped intermediate layers 52, 54 and the quantum-well layers 53. The growth of the barrier layers 51 takes place at a growth temperature of preferably less than 600° C., e.g. at about 575° C. The undoped intermediate layers 52, 54 and the quantum-well layers 53 are preferably grown at a growth temperature of more than 650° C., e.g. at about 665° C. As a result of the higher growth temperature during the growth of the undoped intermediate layers 52, 54 and the quantum-well layers 53, the incorporation of foreign atoms (impurities) is advantageously kept low. Since impurities can form centers for non-radiative recombinations, non-radiative recombinations are further reduced by a reduction of impurities and thus the efficiency of the optoelectronic semiconductor chip is increased further.

The band gaps of the semiconductor materials of the quantum-well layers 53, the barrier layers 51 and the undoped intermediate layers 52, 54 can in particular be adjusted by varying the aluminum content and/or the indium content in the semiconductor material. For example, the quantum-well layers and barrier layers can comprise semiconductor materials with the composition $In_xAl_yGa_{1-x-y}As$ or $In_xAl_yGa_{1-x-y}As_zP_{1-z}$ with $0 \leq x \leq 1$, $0 \leq y \leq 1$, $x+y \leq 1$ and $0 \leq z \leq 1$. In these types of semiconductors, the band gap increases with increasing aluminum content y and decreases with increasing indium content x. In the exemplary embodiment of FIG. 1, for example, the quantum-well layers 53 comprise $Ga_{0.92}In_{0.08}As$, the barrier layers 51 comprise $Al_{0.23}Ga_{0.77}As_{0.94}P_{0.06}$ and the undoped intermediate layers 52, 54 comprise $Al_{0.28}Ga_{0.72}As$.

The barrier layers 51 and the undoped intermediate layers 52, 54 have substantially the same material composition. The barrier layers 51 preferably comprise $Al_{m1}Ga_{1-m1}As_{n1}P_{1-n1}$ with $0 \leq m1 \leq 1$ and $0 \leq n1 \leq 1$. A dopant of the barrier layers 51, such as for example C, can be ignored here since the concentration of the dopant is typically orders of magnitude lower than that of the other material components. For example, the barrier layers can have a dopant concentration of about $2*10^{19}$ cm$^{-3}$.

The undoped intermediate layers 52, 54 preferably comprise $Al_{m2}Ga_{1-m2}As_{n2}P_{1-n2}$ with $0 \leq m2 \leq 1$ and $0 \leq n2 \leq 1$. Preferably, n2=1, i.e. the undoped intermediate layers have no phosphorus content. The following preferably applies here: $|m1-m2| \leq 0.1$, particularly preferably $|m1-m2| \leq 0.05$. Furthermore, the following preferably applies: $|n1-n2| \leq 0.1$, particularly preferably $|n1-n2| \leq 0.05$. Since the material compositions of the barrier layers 51 and the undoped intermediate layers 52, 54 do not differ substantially from one another, the electronic band gap $E_B$ of the barrier layers also does not differ substantially from the electronic band gap $E_{IL}$ of the undoped intermediate layers. The following preferably applies: $|E_B - E_{IL}| \leq 0.1$ eV, particularly preferably $|E_B - E_{IL}| \leq 0.05$ eV. The energetic properties of the undoped intermediate layers 52, 54 therefore correspond substantially to the barrier layers 51.

FIG. 2 shows a bar diagram, which shows the brightness of the emitted radiation $I_e$ (in arbitrary units) for exemplary embodiments of optoelectronic semiconductor chips with various layer thicknesses $d_{IL}$ of the undoped intermediate layers. The bar labelled "0 nm" relates to an exemplary embodiment which is not according to the invention, in which no undoped intermediate layers are arranged between the quantum-well layers and the barrier layers. The bar labelled "ref" relates to a further exemplary embodiment which is not according to the invention, in which the barrier layers are undoped and no undoped intermediate layers are arranged between the quantum-well layers and the barrier layers.

It is shown that, for the layer thicknesses cited, the brightness of the emitted radiation increases with the thickness of the undoped intermediate layers. This can be attributed in particular to the reduction in non-radiative recombinations of charge carriers.

In FIG. 3, a further bar diagram is shown which shows the rise time $t_{rise}$ (left-hand bar) and the fall time $t_{fall}$ (right-hand bar) when the optoelectronic semiconductor chips are operated in pulsed mode with a current strength of 1 A as a function of the layer thickness $d_{IL}$ of the undoped intermediate layers. It is shown that the switching times $t_{rise}$ and $t_{fall}$ increase with increasing layer thickness of the undoped intermediate layers. The increase in switching times is only very low with low layer thicknesses, however, so that comparatively short switching times can be achieved despite the undoped intermediate layers. Furthermore, FIG. 3 shows that the switching times are significantly greater in the comparative example labelled "ref", in which the barrier layers are undoped.

The description with the aid of the exemplary embodiments does not limit the invention thereto. Rather, the invention comprises any new feature and any combination of features, which in particular includes any combination of features in the patent claims, even if this feature or this combination is not itself explicitly stated in the patent claims or exemplary embodiments.

LIST OF REFERENCE NUMBERS

1 Carrier substrate
2 Connecting layer
3 Mirror layer
4 P-type semiconductor region
5 Multi-quantum-well structure
6 N-type semiconductor region
7 First contact layer
8 Second contact layer
9 Radiation exit surface
10 Optoelectronic semiconductor chip
51 Barrier layer
52 Intermediate layer
53 Quantum-well layer
54 Intermediate layer
52c Sublayer of the barrier layer
53 Intermediate layer

The invention claimed is:

1. A method for producing an optoelectronic semiconductor chip, comprising an epitaxial growth of a semiconductor layer sequence having a p-type semiconductor region, an n-type semiconductor region and an active layer arranged between the p-type semiconductor region and the n-type semiconductor region, said active layer being in the form of a multi-quantum-well structure, wherein
the multi-quantum-well structure comprises quantum-well layers and barrier layers,
the barrier layers are doped,
undoped intermediate layers are arranged between the quantum-well layers and the barrier layers, and
the undoped intermediate layers are grown at a higher growth temperature than the doped barrier layers, wherein
the barrier layers comprise $Al_{m1}Ga_{1-m1}As_{n1}P_{1-n1}$ with $0 \leq n1 \leq 1$,
the undoped intermediate layers comprise $Al_{m2}Ga_{1-m2}As_{n2}P_{1-n2}$ with $0 \leq m2 \leq 1$ and $0 \leq n2 \leq 1$, and wherein $|m1-m2| \leq 0.1$ and $|n1-n2| \leq 0.1$.

2. The method according to claim 1, wherein the growth temperature during the growth of the undoped intermediate layers is at least 650° C.

3. The method according to claim 1, wherein the growth temperature during the growth of the barrier layers is less than 600° C.

4. An optoelectronic semiconductor chip, comprising:
a p-type semiconductor region,
an n-type semiconductor region,
an active layer arranged between the p-type semiconductor region and the n-type semiconductor region, said active layer being in the form of a multi-quantum-well structure, wherein
the multi-quantum-well structure comprises quantum-well layers and barrier layers,
the barrier layers are doped, and
undoped intermediate layers are arranged between the quantum-well layers and the barrier layers, wherein
the barrier layers comprise $Al_{m1}Ga_{1-m1}As_{n1}P_{1-n1}$ with $0 \leq m1 \leq 1$ and $0 \leq n1 \leq 1$,
the undoped intermediate layers comprise $Al_{m2}Ga_{1-m2}As_{n2}P_{1-n2}$ with $0 \leq m2 \leq 1$ and $0 \leq n2 \leq 1$, and wherein $|m1-m2| \leq 0.1$ and $|n1-n2| \leq 0.1$.

5. The optoelectronic semiconductor chip according to claim 4, wherein the quantum-well layers each adjoin undoped intermediate layers on both sides.

6. The optoelectronic semiconductor chip according to claim 4, wherein the undoped intermediate layers are between 1 nm and 10 nm thick.

7. The optoelectronic semiconductor chip according to claim 4, wherein the undoped intermediate layers are less than 3 nm thick.

8. The optoelectronic semiconductor chip according to claim 4, wherein the undoped intermediate layers are thinner than the barrier layers.

9. The optoelectronic semiconductor chip according to claim 4, wherein the quantum-well layers comprise $In_xAl_yGa_{1-x-y}As$ with $0 \leq x \leq 1$, $0 \leq y \leq 1$ and $x+y \leq 1$.

10. The optoelectronic semiconductor chip according to claim 4, wherein $n2=1$.

11. The optoelectronic semiconductor chip according to claim 4, wherein an electronic band gap of the undoped intermediate layers differs by no more than 0.1 eV from the electronic band gap of the barrier layers.

12. The optoelectronic semiconductor chip according to claim 4, wherein the barrier layers have the same material composition as the undoped intermediate layers, apart from a dopant.

13. The optoelectronic semiconductor chip according to claim 4, wherein the optoelectronic semiconductor chip is a light-emitting diode emitting in the infrared range of the spectrum.

* * * * *

UNITED STATES PATENT AND TRADEMARK OFFICE
CERTIFICATE OF CORRECTION

PATENT NO. : 10,566,496 B2
APPLICATION NO. : 15/756025
DATED : February 18, 2020
INVENTOR(S) : Andreas Rudolph Page 1 of 1

It is certified that error appears in the above-identified patent and that said Letters Patent is hereby corrected as shown below:

In the Claims

In Column 7, Line 53:
Replace "O$\leq$n1$\leq$1" with --0$\leq$n1$\leq$1--

In Column 7, Line 53, should read:
the barrier layers comprise $Al_{m1}Ga_{1-m1}As_{n1}P_{1-n1}$ with 0$\leq$ m1$\leq$1 and 0$\leq$n1$\leq$1

In Column 7, Line 55:
Replace "O$\leq$m2$\leq$1 and O$\leq$n2$\leq$1" with --0$\leq$m2$\leq$1 and 0$\leq$n2$\leq$1--

Signed and Sealed this
Twenty-third Day of June, 2020

Andrei Iancu
*Director of the United States Patent and Trademark Office*